US008349460B2

(12) United States Patent
Paul

(10) Patent No.: US 8,349,460 B2
(45) Date of Patent: Jan. 8, 2013

(54) ORGANOSILICON COPOLYMER COMPOSITES, METHOD OF MANUFACTURE, AND ARTICLES FORMED THEREFROM

(75) Inventor: Sankar K. Paul, Branford, CT (US)

(73) Assignee: World Properties, Inc., Lincolnwood, IL (US)

(*) Notice: Subject to any disclaimer, the term of this patent is extended or adjusted under 35 U.S.C. 154(b) by 626 days.

(21) Appl. No.: 12/575,861

(22) Filed: Oct. 8, 2009

(65) Prior Publication Data

US 2010/0255319 A1 Oct. 7, 2010

Related U.S. Application Data

(60) Provisional application No. 61/105,940, filed on Oct. 16, 2008.

(51) Int. Cl.
*B32B 27/00* (2006.01)
*C08L 83/00* (2006.01)
*C08K 3/18* (2006.01)
*C08K 3/20* (2006.01)
*C08K 3/22* (2006.01)
*C08K 3/34* (2006.01)
*C08K 3/38* (2006.01)

(52) U.S. Cl. ........ 428/447; 428/209; 428/446; 428/450; 428/901; 523/209; 523/216; 523/217; 524/404; 524/413; 524/433; 524/436; 524/437; 524/445; 524/451; 524/456; 524/588

(58) Field of Classification Search .................. 428/209, 428/446, 447, 450, 901; 523/209, 216, 217; 524/404, 413, 433, 436, 437, 445, 451, 456, 524/588
See application file for complete search history.

(56) References Cited

U.S. PATENT DOCUMENTS

| 4,172,101 | A | 10/1979 | Getson |
| 4,358,556 | A | 11/1982 | Van Abeelen |
| 4,657,951 | A | 4/1987 | Takarada |
| 5,013,772 | A | 5/1991 | Fujiki |
| 5,079,300 | A | 1/1992 | Dubrow |
| 5,256,480 | A | 10/1993 | Inoue |
| 5,700,853 | A | 12/1997 | Yoshida |
| 5,767,193 | A | 6/1998 | Fujiki |
| 6,001,944 | A | 12/1999 | Cumming |
| 6,063,487 | A | 5/2000 | Azechi |
| 6,730,802 | B2 | 5/2004 | Shen |
| 6,831,031 | B2 * | 12/2004 | Ishihara ............... 501/96.4 |
| 6,841,256 | B2 | 1/2005 | Apen |
| 2008/0038528 | A1 | 2/2008 | Paul |

FOREIGN PATENT DOCUMENTS

| JP | 2002327077 A | 11/2002 |
| JP | 2002327078 A | 11/2002 |
| WO | 2007/084819 A2 | 7/2007 |
| WO | 2008/033980 A2 | 3/2008 |
| WO | 2008/034806 * | 3/2008 |
| WO | 2008/036657 A1 | 3/2008 |
| WO | 2008/036662 A2 | 3/2008 |

OTHER PUBLICATIONS

Transmittal and International Search Report, dated Jan. 27, 2010, for PCT/US2009/060486, 7 pages.
Written Opinion for International Search Report, dated Jan. 27, 2010, for PCT/US2009/060486, 8 pages.
The Storage, Handling, Curing, Forming and Pyrolysis of Starfire RD-684, Dec. 2007, Rev 2, 4 pages.
Preliminary Report on Patentability for PCT/US2009/060486, RGP0485PCT, mailed Apr. 28, 2011, 5 pages.

* cited by examiner

*Primary Examiner* — D. S. Nakarani
(74) *Attorney, Agent, or Firm* — Cantor Colburn LLP

(57) ABSTRACT

Organosilicon composites are described, comprising 30 to 90 vol. % of a cured organosilicon copolymer derived by curing an organosilicon polymer having, in the same copolymer, silicon-containing repeating units comprising a silicon hydride and silicon-containing repeating units comprising a $C_{1-10}$ ethylenically unsaturated group; and 10 to 70 vol. % of a dielectric filler. The composites are used in the manufacture of circuit subassemblies.

24 Claims, No Drawings

ORGANOSILICON COPOLYMER COMPOSITES, METHOD OF MANUFACTURE, AND ARTICLES FORMED THEREFROM

BACKGROUND

This disclosure relates to organosilicon copolymer composites, their method of manufacture, and articles formed from the composites, for example subassemblies for use in the manufacture of circuit boards, and electronic packaging substrates and modules.

A wide variety of polymer composites are currently used as dielectric layers in circuit boards, based on polymers such as epoxies, polyimides, polyetherimides, fluorinated polymers such as polytetrafluoroethylene, polyarylene ethers, and polybutadiene and/or polyisoprene. The dielectric and mechanical properties of the polymers are usually adjusted by the inclusion of fillers such as silica, titania, and the like, or by fibrous reinforcement, which can provide stiffness and dimensional stability.

While the known polymer composites are suitable, sometimes marginally, for their present intended purposes, there remains a continuing need for the development of alternative dielectric materials that meet the increasingly stringent near and future demands of the electronics industry. In one important case, the industry is presently seeking materials that are flame retardant, but that do not contain brominated or chlorinated flame retardants (which have proven or suspected health issues) or indeed, any other flame retardant additive. For some advanced electronics applications, such materials must be obtained without significantly adversely affecting the dielectric properties, i.e. dielectric constant and dissipation factor, dimensional stability, and other properties of the composites, such as water absorption and solder and thermal resistance.

SUMMARY

The above-described drawbacks and disadvantages are alleviated by an organosilicon composite comprising 30 to 90 vol. % of a cured organosilicon copolymer derived by curing an organosilicon polymer having, in the same copolymer, silicon-containing repeating units comprising a silicon hydride and silicon-containing repeating units comprising a $C_{1-10}$ ethylenically unsaturated group; and 10 to 70 vol. % of a dielectric filler having a hydrophobically-treated surface, wherein the treated filler has a hydrophobicity such that a time to sink in water is greater than 10 minutes at 23° C.

In another embodiment, an organosilicon composite comprises from 30 to 90 vol. % of a cured organosilicon copolymer derived by curing an organosilicon polymer having, in the same copolymer, silicon-containing repeating units comprising a silicon hydride and silicon-containing repeating units comprising a $C_{1-10}$ ethylenically unsaturated group; and from 10 to 70 vol. % of a dielectric filler having a hydrophobically-treated surface, wherein the composite has a water absorption of less than 0.2% over 24 hours at 23° C.

Articles comprising the foregoing composites are also described, in particular circuit subassemblies comprising a layer of the foregoing organosilicon composites, the layer having a first side and a second side; and a conductive layer disposed on the first side of the organosilicon composite layer.

A method for making an organosilicon composite comprises curing a composition comprising 30 to 90 vol. % of an organosilicon copolymer having silicon-containing repeating units comprising a silicon hydride and silicon-containing repeating units comprising a $C_{1-10}$ ethylenically unsaturated group; and 10 to 70 vol. % of a dielectric filler having a hydrophobically-treated surface, wherein the treated filler has a hydrophobicity such that a time to sink in water is greater than 10 minutes at 23° C.

A method for making an organosilicon composite, comprises curing a composition comprising 30 to 90 vol. % of an organosilicon copolymer having silicon-containing repeating units comprising a silicon hydride and silicon-containing repeating units comprising a $C_{1-10}$ ethylenically unsaturated group; and 10 to 70 vol. % of a dielectric filler having a hydrophobically-treated surface, wherein the composite has a water absorption of less than 0.2% over 24 hours at 23° C.

A composition for the formation of an organosilicon composite comprises 30 to 90 vol. % of an organosilicon copolymer having silicon-containing repeating units comprising a silicon hydride and silicon-containing repeating units comprising a $C_{1-10}$ ethylenically unsaturated group; and 10 to 70 vol. % of a dielectric filler having a hydrophobically-treated surface.

DETAILED DESCRIPTION

It has been found by the inventors hereof that an excellent dielectric composite material for circuit subassemblies and other materials for use in circuits, electronic substrates and packages can be obtained using a crosslinked organosilicon copolymer, and dielectric filler that has been treated to render the surface of the filler hydrophobic. The composites have low water absorption and low dielectric loss, the latter being less than about 0.005, measured over 1 to 10 GHz. The composites can further meet the UL-94 V-0 standards for flame retardancy in the absence of brominated or chlorinated flame retardants, or any other flame retardant additive.

The organosilicon copolymers have, in the same molecule, units comprising silicon hydride (Si—H) functionality, and units containing unsaturated functionality that can react with the silicon hydride groups. An exemplary copolymer of this type has a backbone of silicon linked to carbon in a head to tail configuration, of formula (1), (2), or (3). Formula (1) is of the structure:

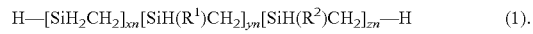

$$H-[SiH_2CH_2]_{xn}[SiH(R^1)CH_2]_{yn}[SiH(R^2)CH_2]_{zn}-H \qquad (1).$$

In formula (1), $R^1$ is, independently at each occurrence, a $C_{1-6}$ alkyl, $C_{1-6}$ alkoxy, $C_{6-10}$ aryl, or $C_{1-6}$ aryloxy, each of which can be substituted with one or more fluorine atoms. In a specific embodiment, $R^2$ is methyl, phenyl, methoxy, ethoxy, or butoxy.

$R^2$ in formula (1) is, independently at each occurrence, a $C_{1-6}$ unsaturated group capable of crosslinking with a silicon hydride group, in particular an alkenyl group or an alkynyl group. Such unsaturated groups generally have terminal unsaturation, and include, for example, allyl, propargyl, and ethynyl.

Further in formula (1), x+y+z=1, with the proviso that x, y, and z are not 0 or 1. Hence, the copolymer includes three different types of units. Still further in formula (1), n has a value from about 10 to about 140, specifically about 20 to about 80.

The copolymers of formula (1) can have a number average molecular weight (Mn) from about 500 Daltons to about 7000 Daltons, specifically from about 1000 Daltons to about 4000 Daltons, more specifically from about 1500 to about 4000 Daltons.

In specific embodiments, $R^1$ is methyl, $R^2$ is allyl, x is about 0.6 to about 0.9, y is about 0.1 to about 0.15, and z is about 0.05 to about 0.1; $R^1$ is methyl, $R^2$ is allyl, x is about 0.6 to about 0.9, y is about 0.07 to about 0.08, and z is about 0.07 to about 0.08; $R^1$ is phenyl, $R^2$ is allyl, x is about 0.6 to about 0.9, y is about 0.1 to about 0.3, and z is about 0.05 to about 0.3; $R^1$ is methyl, $R^2$ is ethynyl, x is about 0.6 to about 0.9, y is about 0.1 to about 0.3, and z is about 0.05 to about 0.3; $R^1$ is methyl, $R^2$ is propargyl, x is about 0.6 to about 0.9, y is about 0.1 to about 0.3, and z is about 0.05 to about 0.3; $R^1$ is phenyl, $R^2$ is propargyl, x is about 0.6 to about 0.9, y is about 0.1 to about 0.3, and z is about 0.05 to about 0.3; $R^1$ is methyl, $R^2$ is allyl, x is about 0.1 to about 0.3, y is about 0.6 to about 0.8, and z is about 0.1 to about 0.2; $R^1$ is methyl, $R^2$ is allyl, x is about 0.2 to about 0.25, y is about 0.1 to about 0.2, and z is about 0.55 to about 0.7; $R^1$ is phenyl, $R^2$ is propargyl, x is about 0.2 to about 0.25, y is about 0.1 to about 0.2, and z is about 0.55 to about 0.7; $R^1$ is phenyl, $R^2$ is allyl, x is about 0.1 to about 0.3, y is 0.4, and z is about 0.35 to about 0.45; $R^1$ is methyl and $R^2$ is, independently at each occurrence, propargyl, or ethynyl; and $R^1$ is, independently at each occurrence, phenyl, methoxy, ethoxy, or butoxy and $R^2$ is allyl.

The copolymer can be obtained by a Grignard coupling process starting from a methoxylated chloroorganosilicon followed by a reduction process using, for example, lithium aluminum hydride ($LiAlH_4$), sodium aluminum hydride ($NaAlH_4$), sodium hydride (NaH) and the like. Such copolymers and their synthesis are described in U.S. Publication No. 2007/093587.

Other copolymers having, in the same molecule, units comprising silicon hydride functionality and units containing unsaturated functionality that can react with the silicon hydride groups are of formula (2):

—[Si(~)(R)(C(~)(H))]$_{xn}$[SiR$^1$R$^2$CH$_2$]$_{yn}$—      (2).

In formula (2), R is, independently at each occurrence, a hydrogen, $C_{1-6}$ alkyl, $C_{1-6}$ alkoxy, $C_{6-10}$ aryl, or $C_{1-6}$ aryloxy, each of which can be substituted with one or more fluorine atoms. In one embodiment, R is a hydrogen or methyl.

Further in formula (2), $R^1$ and $R^2$ are, independently at each occurrence, a hydrogen, $C_{1-6}$ alkyl, $C_{1-6}$ alkoxy, $C_{6-10}$ aryl, $C_{1-6}$ aryloxy, or $C_{1-6}$ unsaturated group capable of crosslinking with a silicon hydride group, in particular an alkenyl group or an alkynyl group. Such unsaturated groups generally have terminal unsaturation, and include, for example, allyl, propargyl, and ethynyl. In one embodiment, $R^1$ and $R^2$ are, independently at each occurrence, a hydrogen, methyl, phenyl, allyl, vinyl, or propargyl group.

At least of fraction of the R, $R^1$, and $R^2$ groups in formula (2) is hydrogen, and at least a fraction of the $R^1$, and $R^2$ groups is unsaturated.

Also in formula (2), n is the degree of polymerization of each unit in the polymer, and 0.1<x<0.8, 0.2<y<0.9 and x+y=1. The symbol "~" represents a polymer branch point, wherein one branch point is connected to the silicon atom and one to the carbon atom. Further details regarding the structure of branched polyorganosilicons are set forth in U.S. Pat. No. 5,153,295 to Whitmarsh.

Another copolymer having, in the same molecule, units comprising silicon hydride functionality and units containing unsaturated functionality that can react with the silicon hydride groups is of formula (3):

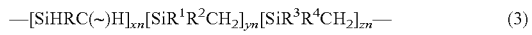

—[SiHRC(~)H]$_{xn}$[SiR$^1$R$^2$CH$_2$]$_{yn}$[SiR$^3$R$^4$CH$_2$]$_{zn}$—      (3)

In formula (3), R is, independently at each occurrence, a hydrogen, $C_{1-6}$ alkyl, $C_{1-6}$ alkoxy, $C_{6-10}$ aryl, or $C_{1-6}$ aryloxy, each of which can be substituted with one or more fluorine atoms. In one embodiment, R is a hydrogen or methyl.

Further in formula (3), $R^1$ and $R^2$ are, independently at each occurrence, a hydrogen, $C_{1-6}$ alkyl, $C_{1-6}$ alkoxy, $C_{6-10}$ aryl, or $C_{1-6}$ aryloxy. In one embodiment, $R^1$ and $R^2$ are, independently at each occurrence, a hydrogen, methyl, or phenyl.

Also in formula (3), $R^3$ and $R^4$, are, independently at each occurrence, a $C_{1-6}$ alkyl, $C_{1-6}$ alkoxy, $C_{6-10}$ aryl, $C_{1-6}$ aryloxy, or $C_{1-6}$ unsaturated group capable of crosslinking with a silicon hydride group, in particular an alkenyl group or an alkynyl group. Such unsaturated groups generally have terminal unsaturation, and include, for example, allyl, propargyl, and ethynyl. In one embodiment, $R^3$ and $R^4$ are, independently at each occurrence, a methyl, phenyl, vinyl, allyl, or propargyl group.

In formula (3), at least of fraction of the R, $R^1$, and $R^2$ groups are hydrogen, and at least a fraction of the $R^3$ and $R^4$ groups are unsaturated.

Further in formula (3), n is the degree of polymerization of each unit in the polymer, and 0.1<x<0.8, 0<y<0.8, 0.2<z<0.8 and x+y+z=1. The symbol "~" represents a polymer branch point, wherein one branch point is connected to the silicon atom and one to the carbon atom.

The copolymers of formulas (2) and (3) can have a weight average molecular weight (Mw) from about 300 Daltons to about 250,000 Daltons, more specifically from about 1500 to about 100,000 Daltons, determined by gel permeation chromatography in tetrahydrofuran using polystyrene standards.

Grignard reactions can also be used for the preparation of copolymers of formulas (2) and (3), as set forth in WO2007/084819 to Shen.

Another copolymer having, in the same molecule, units containing silicon hydride functionality and units containing unsaturated functionality that can react with the silicon hydride groups is a polysiloxane of formula (4):

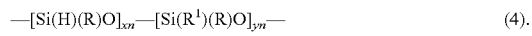

—[Si(H)(R)O]$_{xn}$—[Si(R$^1$)(R)O]$_{yn}$—      (4).

In formula (4), $R^1$ is, independently at each occurrence, a $C_{1-6}$ alkyl, $C_{1-6}$ alkoxy, $C_{6-10}$ aryl, or $C_{1-6}$ aryloxy, each of which can be substituted with one or more fluorine atoms. In one embodiment, each R is methyl.

Also in formula (4), $R^1$ is, independently at each occurrence a $C_{1-10}$ group capable of crosslinking with a silicon hydride group, in particular an alkenyl group or an alkynyl group. Exemplary groups can be derived, for example, from compounds at least two unsaturated carbon-carbon bonds, for example dicyclopentadiene, isoprene, 4-vinyl-1-cyclohexene, and the like.

Further in formula (4), n is the degree of polymerization of each unit in the polymer, and x+y=1, with the proviso that x and y are not 1 or 0. In one embodiment, x is 0.6 to 0.9, and y is 0.1 to 0.4.

The molecular weight of the polymers can be from about 1500 to about 4000 Daltons. The copolymer of formula (4) can be obtained by reacting a hydride-substituted siloxane with the compound having at least two unsaturated carbon-carbon bonds, for example dicyclopentadiene, isoprene, and 4-vinyl-1-cyclohexene in the presence of a catalyst, such as a platinum-containing catalyst. Such copolymers and their synthesis are described in WO 2008/36657.

Another copolymer having, in the same molecule, units containing silicon hydride functionality and units containing unsaturated functionality that can react with the silicon hydride groups is a polysiloxane of formula (5):

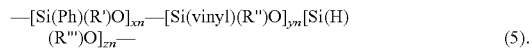

—[Si(Ph)(R')O]$_{xn}$—[Si(vinyl)(R'')O]$_{yn}$[Si(H)(R''')O]$_{zn}$—      (5).

In formula (5), each R', R'', and R''' is independently hydrogen, methyl, vinyl, or phenyl. Because each of R', R'', and R''' can be hydrogen, methyl, vinyl, or phenyl, the copolymer of formula (5) can have as two different units or three different units. In one embodiment, R' is vinyl or methyl; R" is hydrogen or methyl; and R''' is hydrogen or methyl. In another embodiment, R' methyl; R" is methyl; and R''' is methyl.

Also in formula (5), n is 1 to 600, and x+y+z=1, with the proviso that x, y, and z are not 1 or 0. In one embodiment, x=0.05 to 0.8, y=0.05 to 0.5, and z=0.05 to 0.8.

It is to be understood that the units can be arranged in any order, and the copolymers can be cyclic or non cyclic. When the copolymers are non-cyclic, the copolymer terminal groups are —OH. The copolymers of formula (5) can have a molecular weight from about 450 Daltons to about 250,000 Daltons, specifically about 500 to about 4000 Daltons, more specifically about 750 to about 3,000 Daltons.

The copolymer of formula (5) can be obtained by reacting diphenyl dichlorosilane, vinylmethyldichlorosilane, and methyldichlorosilane. Such copolymers and their synthesis are described in WO 2008/036657 and in WO 2008/036662

Still another copolymer having, in the same molecule, units comprising silicon hydride functionality and units containing unsaturated functionality that can react with the silicon hydride groups is a polysiloxane of formula (6):

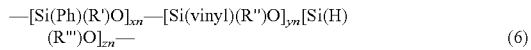

—[Si(Ph)(R')O]$_{xn}$—[Si(vinyl)(R")O]$_{yn}$[Si(H)(R''')O]$_{zn}$—  (6)

In formula (6), each R', R", and R''' is independently hydrogen, methyl, vinyl, or phenyl. In one embodiment, R' is vinyl or methyl; R" is hydrogen or methyl; and R''' is hydrogen or methyl.

Also in formula (6), n is 1 to 600, and x+y+z=1, with the proviso that none of x, y, and z is one, and one of x, y, or z is zero. In one embodiment, x=0.05 to 0.8, y=0.05 to 0.5, and z=0.05 to 0.8. In a specific embodiment, x is zero, and R" and R''' are methyl. Polymers of this type can be cured in the presence of about 1 to about 50 ppm of a platinum-containing catalyst, at about 21° C. to about 300° C. in about 10 minutes to about 24 hours. Different ratios of vinyl groups to silicon hydride groups alters the curing speed of the copolymers, as well as the properties of the copolymers. In one embodiment, where x is zero, the ratio of vinyl:hydride substituents is about 1:1 to about 1:10, specifically about 1:1 to about 1:6, more specifically about 1:1 to about 1:4, about 1:1 to about 1:3, or about 1:1 to about 1:2.

The units in the copolymers of formula (6) can be arranged in any order, and the copolymers can be cyclic or non cyclic. When the copolymers are non-cyclic, the copolymer terminal groups are —OH. The copolymers of formula (6) can have a molecular weight from about 450 Daltons to about 250,000 Daltons, specifically about 500 to about 4000 Daltons, more specifically about 750 to about 3,000 Daltons.

The copolymer of formula (6) can be obtained by reacting two of a phenyl dichlorosilane, vinylmethyldichlorosilane, or methyldichlorosilane. Such copolymers and their synthesis are described in WO 2008/36657.

It is also possible to use a combination of copolymers. For example, the copolymers of formula (5) and formula (6) can be blended in a weight ratio from about 1:10 to about 10:1. Such blends can be crosslinked as described below.

The stoichiometric ratio of silicon to carbon to hydrogen in the above-described copolymers can be controlled and predetermined by varying the values of x and y, or x, y, and z. Copolymers with a lower ratio of silicone hydride units are less reactive than copolymers having a carbon:silicon ratio of 1:1 (stoichiometric polymer), are particularly suitable for use in composites, particularly glass fiber reinforced composites. Low silicon-hydride content is usually due to a large number of carbon bearing substituents on the silicon atoms in the polymer compared to stoichiometric polymer.

The silicon carbide copolymers can be cured by methods known for promoting the reaction between silicon hydride groups and alkenyl or alkynyl groups. In one embodiment, platinum-containing catalyst is present, such as chloroplatinic acid, and platinum complexes. Other curing agents include various boron-hydrogen compounds such as decaborane, silanol containing compounds, as well as most amine compounds. The platinum catalyst or other cure initiator can be is present in an amount of about one part per million (ppm) to about 50 ppm, based on the weight of the copolymer used.

In one embodiment, for example where a blend of copolymers of formula (5) and formula (6) is used, curing can be effected in the presence of 0.1 to 1.5% of a peroxide at about 21° C. to about 500° C. Specifically organic peroxides are dicumyl peroxide, t-butyl perbenzoate, 2,5-dimethyl-2,5-di(t-butyl peroxy)hexane, α,α-di-bis(t-butyl peroxy)diisopropylbenzene, and 2,5-dimethyl-2,5-di(t-butyl peroxy)hexyne-3, all of which are commercially available. Dual cure systems can also be used, for example a combination of a platinum catalyst and UV cure, or a peroxide catalyst and a UV cure. A curing agent can be added to the resin system to accelerate the curing reaction of the polyenes having olefinic reactive sites.

In certain instances, thermal crosslinking can be used to produce hardened near-ceramic coatings and matrices. "Near-ceramic materials" as used herein refers to Si-based pre-ceramic materials formed by crosslinking the copolymer by substantial removal (i.e., greater than about 80%, specifically greater than about 90%) of the Si—H bonding while leaving the majority of the C—H bonding intact (i.e., greater than about 80%, specifically greater than about 90%), thereby producing materials aspects of an organic resin (e.g. toughness) capable of sustained use at greater than about 500° C. and a hardness greater than about 1000 GPa. The near-ceramic material can be produced by heating the copolymer to a temperature about 400° C. to about 650° C., specifically about 500° C. to about 700° C., at a heating rate of about 0.1° C./min to about 15° C./minute, specifically about 0.5° C./minute to about 3° C./minute, and holding for a time period of about 5 minutes and about 2 hours. The copolymer can be heated in an inert gas environment (for example, nitrogen, argon, or helium), a hydrogen gas environment, or combinations thereof to produce the near-ceramic material.). The amount of C—H bonding left in the near-ceramic materials can be adjusted by varying the heating conditions. The near-ceramic materials can be used in fiberglass-based circuit boards that have stiffness greater than about 30 GPa and a thermal expansion coefficient near to that of silicon (about 2-3 ppm/° C.).

The silicon composite materials further include particulate fillers. Exemplary fillers include titanium dioxide (rutile and anatase), barium titanate, strontium titanate, silica (particles and hollow spheres) including fused amorphous silica; corundum, wollastonite, aramide fibers (e.g., Kevlar), fiberglass, Ba$_2$Ti$_9$O$_{20}$, glass spheres, quartz, boron nitride, aluminum nitride, silicon carbide, beryllia, alumina, magnesia, mica, talcs, nanoclays, aluminosilicates (natural and synthetic), and magnesium hydroxide. Combinations of fillers can also be used. More specifically, rutile titanium dioxide and amorphous silica are especially desirable because these fillers have a high and low dielectric constant, respectively, thereby permitting a broad range of dielectric constants combined with a low dissipation factor to be achieved in the final cured product by adjusting the respective amounts of the two fillers in the composition. These fillers can be used alone or in combination.

In a specific feature of the silicon composite, the particulate filler is treated to render the surface thereof more hydrophobic. Without being bound by theory, it is believed that such treatment reduces interaction of the filler with the silicon hydride groups. Examples of the surface-treating agents include, without limitation, silanes, compounds with active hydrogen groups such as hydride-substituted polydiorganosiloxanes, silica-silanes, alumina, alumina-silica, alumina-silica-silanes, and the like. Specific compounds include methyl hydrogen polysiloxane such as APS-219 from Advanced Polymers Inc., MH1107 Fluid from Dow Corning, silane coupling agents such as vinyltrichlorosilane, vinyltrimethoxysilane, vinyltriethoxysilane, vinyltris(β-methoxyethoxy)silane, β-(3,4-epoxycyclohexyl)ethyltrimethoxysilane, γ-glycidoxypropyltrimethoxysilane, γ-glycidoxypropylmethyldiethoxysilane, γ-glycidoxypropyltriethoxysilane, γ-methacryloxypropylmethyldimethoxysilane, γ-methacryloxypropyltrimethoxysilane, γ-methacryloxypropylmethyldiethoxysilane, γ-methacryloxypropyltriethoxysilane, N-β(aminoethyl)γ-aminopropylmethyldimethoxysilane, N-β(aminoethyl)γ-aminopropyltrimethoxysilane, N-β(aminoethyl)γ-aminopropyltriethoxysilane, γ-aminopropyltrimethoxysilane, γ-aminopropyltriethoxysilane, N-phenyl-γ-aminopropyltrimethoxysilane and γ-mercaptopropyltrimethoxysilane. Combinations comprising at least one of the foregoing can be used.

The circuit substrate further optionally includes woven or non-woven, thermally stable webs of a suitable fiber, specifically glass (E, S, and D glass), including flat glass or close-weaved fiber glass, or high temperature polyester fibers (e.g., KODEL from Eastman Kodak). Such thermally stable fiber reinforcement provides a circuit subassembly with a means of controlling shrinkage upon cure. In addition, the use of the woven web reinforcement renders a circuit subassembly with a relatively high mechanical strength and reduced coefficient of thermal expansion in the plane of the subassembly.

Examples of the woven fiberglass web are set forth in Table 1.

TABLE 1

| Manufacturer | Style | Thickness, in. (um) |
| --- | --- | --- |
| Fiber Glass | 519-A | 0.0015 (38.1) |
| Clark-Schwebel | 112 | 0.0032 (81.3) |
| Clark-Schwebel | 1080 | 0.0025 (63.5) |
| Clark-Schwebel | 1674 | 0.004 |
| Burlington | 7628 | 0.0068 (172.7) |
| JPS Composite Materials | 106 | 0.0013 |
| JPS Composite Materials | 3313 | 0.0033 |
| JPS Composite Materials | 1067 | 0.0014 |
| JPS Composite Materials | 1280 | — |

The relative amounts of copolymer, particulate filler and optional glass fiber are selected so as to provide a circuit subassembly with the desired properties, including dielectric constant, dissipation factor, stiffness, water resistance, bonding to the conductive layer, and the like. In one embodiment, the organosilicon composite comprises, based on the total weight of the composite, from 30 to 90 volume percent (vol. %) of the organosilicon copolymer, specifically from 40 to 80 vol. %, even more specifically from 50 to 70 vol. % of the organosilicon copolymer; and from 10 to 70 vol. %, specifically from 20 to 60 vol. % even more specifically from 30 to 50 vol. % of the filler, wherein no glass fibers are present.

In another embodiment, the organosilicon composites comprise, based on the total weight of the organosilicon composites, from 30 to 50 vol. % of the organosilicon copolymer, from 25 to 50 vol. % of the filler, and from to 15 to 30 vol. % of the glass fibers. More specifically, the organosilicon composites comprise, based on the total weight of the organosilicon composites, from 35 to 45 vol. % of the organosilicon copolymer, from 30 to 45 vol. % of the filler, and from to 20 to 25 vol. % of the glass fibers In addition to the one or more of the organosilicon polymers described above, fillers, and any catalysts or cure initiators, the compositions for the formation of the silicon composites can optionally comprise additives such as crosslinking agents, resin modifiers (e.g., flow modifiers or resins that act as diluents to reduce the density of crosslinking), viscosity modifiers, coupling agents, wetting agents, and antioxidants. The particular choice of additives depends upon the intended use of the composite, and is selected to enhance or not substantially adversely affect properties such as dielectric constant, dissipation factor, water absorbance, and flame retardance. In one embodiment, the resin modifiers contain phenyl and or vinyl groups. For example, an oligomer containing ethylenic unsaturation (e.g., an organosilicon oligomer containing vinyl groups), can be present in an amount effective to reduce premature reaction of polymers and copolymers containing Si—H groups.

In a specific embodiment, the resin modifier is an elastomer containing ethylenic unsaturation, for example an unsaturated polybutadiene- or polyisoprene-containing elastomer. This component can be a random or block copolymer of primarily 1,3-addition butadiene or isoprene with an ethylenically unsaturated monomer, for example a vinylaromatic compound such as styrene or alpha-methyl styrene, an acrylate or methacrylate such a methyl methacrylate, or acrylonitrile. Exemplary elastomers are solid, thermoplastic elastomer comprising a linear or graft-type block copolymer having a polybutadiene or polyisoprene block, and a thermoplastic block that preferably is derived from a monovinylaromatic monomer such as styrene or alpha-methyl styrene. Suitable block copolymers of this type include styrene-butadiene-styrene triblock copolymers, for example those available from Dexco Polymers, Houston, Tex., under the trade name VECTOR 8508M, from Enichem Elastomers America, Houston, Tex., under the trade name SOL-T-6302, and those from Fina Oil and Chemical Company, Dallas, Tex., under the trade name FINAPRENE 401; styrene-butadiene diblock copolymers; and mixed triblock and diblock copolymers containing styrene and butadiene, for example those available from Shell Chemical Corporation, Houston, Tex., under the trade name KRATON D1118. Kraton D1118 is a mixed diblock/triblock styrene and butadiene containing copolymer, containing 30 vol. % styrene. Such modifiers can act to increase adhesion between layers. The elastomers are present in the compositions in an amount of less than about 3 wt %, specifically about 0.1 to less than about 3 wt. %.

Free radical-curable monomers can also be added for specific property or processing modifications, for example to increase the crosslink density of the resin system after cure. Exemplary crosslinking agents include, for example, di, tri-, or higher ethylenically unsaturated monomers such as divinyl benzene, triallyl cyanurate, diallyl phthalate, and multifunctional acrylate monomers (e.g., Sartomer resins available from Arco Specialty Chemicals Co., Newtown Square, Pa.), or combinations thereof, all of which are commercially available. The crosslinking agent, when used, is present in the compositions in an amount of up to about 20 wt. %, specifically 1 to 15 wt. %, based on the total polymer matrix composition.

In an especially advantageous feature the organosilicon composite achieves a flame retardance rating of at least UL94

V-0, in the absence of brominated or chlorinated flame retardants, or any other flame retardant additives while retaining low dielectric loss and good thermal stability, and with minimum acid weight loss as most nonhalogen flame retardants have varying degree acid weight loss during the electroless nickel, immersion gold (ENIG) process.

The silicon composites are used as a dielectric material in electronic applications, for example in circuit subassemblies including circuit laminates, packaging substrate laminates and build-up materials, bond plies, and resin coated conductive layers. Certain subassemblies, for example circuit laminates, have a conductive layer, e.g., copper, fixedly attached to the dielectric substrate layer. Double clad laminates have two conductive layers, one on each side of the dielectric layer. Patterning a conductive layer of a laminate, for example by etching, provides a circuit. Multilayer circuits comprise a plurality of conductive layers, at least one of which contains a conductive wiring pattern. Typically, multilayer circuits are formed by laminating one or more circuit layers together using bond plies and, in some cases, resin coated conductive layers, in proper alignment using heat and/or pressure. After lamination to form the multilayer circuit, known hole forming and plating technologies can be used to produce useful electrical pathways between conductive layers. Sometimes, additional circuit layers are required. These can be added using build-up materials and known processing methods for patterning these layers.

In a method for forming a circuit subassembly, such as a single clad laminate, the pre-crosslinked polymer is combined with the filler and catalyst or cure initiator to form a composite precursor composition. If needed to dissolve the polymer or to decrease the viscosity of the composite precursor composition, the polymer can be dissolved in a suitable solvent. The solvent is selected so as to dissolve polymer and to have a convenient evaporation rate for forming the article, for example forming and drying a coated layer. Possible solvents include xylene, toluene, methyl ethyl ketone, methyl isobutyl ketone, hexane, and higher liquid linear alkanes, such as heptane, octane, nonane, and the like, cyclohexane, isophorone, and various terpene-based solvents. The concentration of the polymer in solution is not critical and will depend on the solubility of the polymer, the method of application, and other factors. In general, a casting or coating solution comprises about 1 to about 50 wt %, more specifically about 5 to about 20 wt % of the polymer, based on the total weight of the casting solution.

The composite precursor composition is applied to a glass fabric, by known methods in the art, for example by dip, spray, wash, or other suitable coating technique. If the composite precursor composition exhibits phase separation during coating or drying, the uniformity can be improved by increasing the solution temperature. The composite precursor composition can be uncured or partially cured in the solvent removal (drying) process, or the composite precursor composition can be partially or fully cured, if desired, after drying.

After application of the composite precursor composition, the polymer can be partially cured or cured, and stored or used directly to form a circuit laminate or multilayer circuit laminate. The laminate can be formed by means known in the art. In one embodiment, the lamination process entails placing one or more layers of the coated conductive layer between one more sheets of coated or uncoated conductive layers (an adhesive layer can be disposed between the conductive layer and at least one dielectric substrate layer). The layered material can then be stored prior to lamination and cure, partially cured and then stored, or laminated and cured after stacking. Lamination and curing can be by a one-step process, for example using a vacuum press, or by a multiple-step process. In an exemplary multiple-step process, a conventional platinum/peroxide cure step at temperatures of about 120° C. to about 175° C. is conducted, and the partially cured stack can then be subjected to a high temperature cure step under an inert atmosphere. The temperature used in the second stage is typically about 225° C. to about 325° C. This high temperature cure can be carried out in an oven but can also be performed in a press, namely as a continuation of the initial lamination and cure step. Particular lamination temperatures and pressures will depend upon the particular adhesive composition and the substrate composition, and are readily ascertainable by one of ordinary skill in the art without undue experimentation.

Suitable conductive layers include a thin layer of a conductive metal such as a copper foil presently used in the formation of circuits, for example, electrodeposited copper foils. Useful copper foils typically have thicknesses of about 9 to about 180 micrometers.

The copper foil can be made either by the electrodeposition (ED) on a rotating stainless steel drum from a copper sulfate bath, or by the rolling of solid copper bars. Where ED copper foil is used, the initial roughness of the base foil is created in the foil plating process on the "bath side" (or matte side) of the foil. Additional roughness is created in a secondary plating step. Where rolled foil used, roughness is imparted to the initially smooth and shiny foil by a secondary plating step. Conventional ED copper foil made for the circuit industry has had treated side Rz values of 7 to 20 micrometers (um) (corresponding to Rq values of about 1.2 to 4 um) when measured by the WYCO Optical Profiler. Contact profilometers tend to yield lower values, due to the stylus deforming the copper treatment as the measurement is made. The treated side of rolled copper foil exhibits Rz values of 3.5 to 5.5 um (corresponding to Rq values of 0.45 to 0.9 um). "Reverse treated" ED foils, such as Oak-Mitsui MLS-TOC-500 can also exhibit Rq values similar to those of rolled foils. The lower profile ED foils currently exhibit Rz values of 2 to 3 um. By WYCO measurement, the shiny side of rolled foil exhibits an Rz value of about 0.7 um and a corresponding Rq of about 0.1 um.

Both rolled and ED foils specially treated for the circuit industry are available from a number of commercial manufacturers. For example, low profile copper foils are commercially available from Oak Mitsui under the trade name "TOC-500" and "TOC-500-LZ", from Nippon Denkai under the trade name "USLP", and from Furukawa under the trade name "F1WS". High profile copper foils are commercially available from Circuit Foil under the trade name "TWS."

More recently, other types of low profile electrodeposited foils have been commercially available. These include Oak Mitsui products SQ-VLP, with an Rq value measured by the WYCO of 0.7 um and MQ-VLP with a WYCO Rq value of 0.47 um.

The subassemblies have a UL94 rating of V-0, without the use of brominated or chlorinated flame retardants, or any other flame retardant additive, e.g., magnesium hydroxide, nitrogen-containing compounds such as triazene, and phosphorus-contain flame retardant additives.

In addition, the subassemblies have low water absorption, generally less than about 0.5%, specifically less than about 0.2% over 24 hours at 23° C.

The electrical and thermal properties of the subassemblies are consistent with those desired in circuits for modern electrical and electronic applications, particularly a dissipation factor of less than about 0.005 measured over 1 to 10 GHz. The coefficient of thermal expansion (CTE) of the organosilicon composite dielectric layer can be adjusted to match the CTE of the conductive layer. In one embodiment, the CTE of the organosilicon composite dielectric layer is 40 to 60 ppm, measured over a temperature of 0 to 228° C.

The subassemblies can have other advantageous properties, such as no blister during lamination or soldering; and/or excellent bond strength to the conductive layer (e.g., greater than 3.0 pli, or greater than 4.0 pli to 0.5 oz TWS copper foil. In one embodiment, the bond strength to 0.5 oz MLS copper foil treated with Xm is greater than 4 pli, specifically greater than 5.0 pli.

Good bond can be obtained by use of an adhesive compositions disposed between and in contact with the conductive layer and the organosilicon composite layer. An exemplary adhesive composition comprises 20 to 100 wt. % of a poly (arylene ether); optionally, a polybutadiene or polyisoprene polymer in an amount of 0 to 80 wt. %; and optionally, an elastomeric block copolymer comprising units derived from an alkenyl aromatic compound and a conjugated diene in an amount of 0 to 80 wt. %. The poly(arylene ether) can optionally be carboxy-functionalized, for example the reaction product of a poly(arylene ether) and a cyclic carboxylic acid anhydride such as maleic anhydride, succinic anhydride, glutaric anhydride, adipic anhydride, and phthalic anhydride. In one embodiment, the polybutadiene is syndiotactic polybutadiene. In one embodiment, the polybutadiene or polyisoprene polymer is carboxy-functionalized. Functionalization can be accomplished using a polyfunctional compound having in the molecule both (i) a carbon-carbon double bond or a carbon-carbon triple bond, and (ii) one or more of a carboxy group, including a carboxylic acid, anhydride, amide, ester, or acid halide. A preferred carboxy group is a carboxylic acid or ester. Examples of polyfunctional compounds that can provide a carboxylic acid functional group include maleic acid, maleic anhydride, fumaric acid, and citric acid. Exemplary elastomeric block copolymers include styrene-butadiene diblock copolymer (SB), styrene-butadiene-styrene triblock copolymer (SBS), styrene-isoprene diblock copolymer (SI), styrene-isoprene-styrene triblock copolymer (SIS), styrene-(ethylene-butylene)-styrene triblock copolymer (SEBS), styrene-(ethylene-propylene)-styrene triblock copolymer (SEPS), and styrene-(ethylene-butylene) diblock copolymer (SEB), or a combination comprising at least one of the foregoing elastomeric block copolymers. The adhesive can further optionally comprise additives such as cure initiators, crosslinking agents, viscosity modifiers, coupling agents, wetting agents, flame retardants, fillers, and antioxidants. The improved bond strength with use of this adhesive can advantageously be maintained at high temperatures, such as those encountered during soldering operations (e.g., 550° F. or 288° C.). Such adhesive compositions have been described, for example, in 2008/0038528, which is incorporated herein by reference in its entirety.

The singular forms "a," "an," and "the" include plural referents unless the context clearly dictates otherwise. The endpoints of all ranges directed to the same characteristic or component are independently combinable and inclusive of the recited endpoint. As used herein and throughout, "disposed," "contacted," and variants thereof refers to the complete or partial direct physical contact between the respective materials, substrates, layers, films, and the like. Further, the terms "first," "second," and the like herein do not denote any order, quantity, or importance, but rather are used to distinguish one element from another. All cited patents and applications are incorporated herein by reference.

While specific embodiments have been shown and described, various modifications and substitutions can be made thereto without departing from the spirit and scope of the invention. Accordingly, it is to be understood that the present invention has been described by way of illustration and not limitation.

What is claimed is:

1. An organosilicon composite, comprising:
   30 to 90 vol. % of a cured organosilicon copolymer derived by curing an organosilicon polymer having, in the same copolymer, silicon-containing repeating units comprising a silicon hydride and silicon-containing repeating units comprising a $C_{1-10}$ ethylenically unsaturated group; and
   10 to 70 vol. % of a dielectric filler having a hydrophobically-treated surface; wherein the treated filler has a hydrophobicity such that a time to sink in water of the composite is greater than 10 minutes at 23° C.; and/or wherein the composite has a water absorption of less than 0.2% over 24 hours at 23° C.

2. The organosilicon composite of claim 1, having a UL94 flammability rating of V-0.

3. The organosilicon composite of claim 1, having a dielectric loss of less than 0.005, measured over 1 to 10 GHz.

4. The organosilicon composite of claim 1, derived from the crosslinking of a organosilicon of the formula

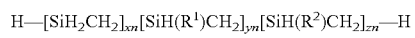

wherein
   $R^1$ is, independently at each occurrence, a $C_{1-6}$ alkyl, $C_{1-6}$ alkoxy, $C_{6-10}$ aryl, or $C_{1-6}$ aryloxy, each of which can be substituted with one or more fluorine atoms;
   $R^2$ is, independently at each occurrence, a $C_{1-6}$ ethylenically unsaturated group capable of crosslinking with a silicon hydride group;
   $x+y+z=1$ with the proviso that x, y, and z are not 0 or 1; and
   n has a value from about 10 to about 140.

5. The organosilicon composite of claim 4, wherein $R^1$ is methyl, phenyl, methoxy, ethoxy, or butoxy; and $R^2$ is allyl, propargyl, or ethynyl.

6. The organosilicon composite of claim 5, where $R^1$ is methyl and $R^2$ is allyl.

7. The organosilicon composite of claim 1, derived from the crosslinking of a organosilicon of the formula

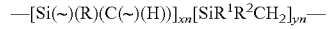

wherein:
   R is, independently at each occurrence, a hydrogen, $C_{1-6}$ alkyl, $C_{1-6}$ alkoxy, $C_{6-10}$ aryl, or $C_{1-6}$ aryloxy, each of which can be substituted with one or more fluorine atoms;
   $R^1$ and $R^2$ are, independently at each occurrence, a hydrogen, $C_{1-6}$ alkyl, $C_{1-6}$ alkoxy, $C_{6-10}$ aryl, $C_{1-6}$ aryloxy, or $C_{1-6}$ unsaturated group capable of crosslinking with a silicon hydride group;
   at least of fraction of the R, $R^1$, and $R^2$ is hydrogen, and at least a fraction of the $R^1$, and $R^2$ groups is unsaturated;
   n is the degree of polymerization of each unit in the polymer, and $0.1<x<0.8$, $0.2 \leq y<0.9$, and $x+y=1$; and
   "~" represents a polymer branch point, wherein one branch point is connected to the silicon atom and one to the carbon atom.

8. The organosilicon composite of claim 7, wherein R is a hydrogen or methyl, and $R^1$ and $R^2$ are, independently at each occurrence, a hydrogen, methyl, phenyl, allyl, vinyl, or propargyl group.

9. The organosilicon composite of claim 1, derived from the crosslinking of a organosilicon of the formula

wherein
R is, independently at each occurrence, a hydrogen, $C_{1-6}$ alkyl, $C_{1-6}$ alkoxy, $C_{6-10}$ aryl, or $C_{1-6}$ aryloxy, each of which can be substituted with one or more fluorine atoms;
$R^1$ and $R^2$ are, independently at each occurrence, a hydrogen, $C_{1-6}$ alkyl, $C_{1-6}$ alkoxy, $C_{6-10}$ aryl, or $C_{1-6}$ aryloxy;
$R^3$ and $R^4$, are, independently at each occurrence, a $C_{1-6}$ alkyl, $C_{1-6}$ alkoxy, $C_{6-10}$ aryl, $C_{1-6}$ aryloxy, or $C_{1-6}$ unsaturated group capable of crosslinking with a silicon hydride group;
at least of fraction of the R, $R^1$, and $R^2$ groups is hydrogen, and at least a fraction of the $R^3$ and $R^4$ groups are unsaturated;
n is the degree of polymerization of each unit in the polymer, and $0.1 < x < 0.8$, $0 < y < 0.8$, $0.2 < z < 0.8$ and $x+y+z=1$; and
"~" represents a polymer branch point, wherein one branch point is connected to the silicon atom and one to the carbon atom.

10. The organosilicon composite of claim 9, wherein R is a hydrogen or methyl, and $R^1$ and $R^2$ are, independently at each occurrence, a hydrogen, methyl, or phenyl, and $R^3$ and $R^4$ are, independently at each occurrence, a methyl, phenyl, vinyl, allyl, or propargyl group.

11. The organosilicon composite of claim 1, derived from the crosslinking of a organosilicon of the formula $$—[Si(H)(R)O]_{xn}—[Si(R^1)(R)O]_{yn}—$$

wherein
R is, independently at each occurrence, a $C_{1-6}$ alkyl, $C_{1-6}$ alkoxy, $C_{6-10}$ aryl, or $C_{1-6}$ aryloxy, each of which can be substituted with one or more fluorine atoms;
$R^1$ is, independently at each occurrence, a $C_{1-10}$ group capable of crosslinking with a silicon hydride group; and
n is the degree of polymerization of each unit in the polymer, and $x+y=1$, with the proviso that x and y are not 1 or 0.

12. The organosilicon composite of claim 11, wherein each R is methyl, $R^1$ is derived from a compound having at least two unsaturated carbon-carbon bonds, preferably dicyclopentadiene, isoprene, 4-vinyl-1-cyclohexene, and x is 0.6 to 0.9, and y is 0.1 to 0.4.

13. The organosilicon composite of claim 1, derived from the crosslinking of a organosilicon of the formula $$—[Si(Ph)(R')O]_{xn}—[Si(vinyl)(R'')O]_{yn}[Si(H)(R''')O]_{zn}—$$

wherein
each R', R", and R'" is independently hydrogen, methyl, vinyl, or phenyl;
n is 1 to 600, and
$x+y+z=1$, with the proviso that x, y, and z are not 1 or 0.

14. The organosilicon composite of claim 13, wherein R' is vinyl or methyl, R" is hydrogen or methyl, R'" is hydrogen or methyl, $x=0.05$ to 0.8, $y=0.05$ to 0.5, and $z=0.05$ to 0.8.

15. The organosilicon composite of claim 13, wherein R' is methyl, R" is methyl, R'" is methyl, and $x=0.05$ to 0.8, $y=0.05$ to 0.5, and $z=0.05$ to 0.8.

16. The organosilicon composite of claim 1, derived from the crosslinking of a organosilicon of the formula $$—[Si(Ph)(R')O]_{xn}—[Si(vinyl)(R'')O]_{yn}[Si(H)(R''')O]_{zn}—$$

wherein
R', R", and R'" is independently hydrogen, methyl, vinyl, or phenyl;
n is 1 to 600; and
$x+y+z=1$, with the proviso that none of x, y, and z is one, and one of x, y, or z is zero.

17. The organosilicon composite of claim 16, wherein R' is vinyl or methyl, R" is hydrogen or methyl, R'" is hydrogen or methyl, $x=0$ or 0.05 to 0.8, $y=0$ or 0.05 to 0.5, and $z=0$ or 0.05 to 0.8.

18. The organosilicon composite of claim 16, wherein x is zero, and R" and R'" are methyl.

19. The organosilicon composite of claim 1, wherein the filler is titanium dioxide, barium titanate, strontium titanate, silica, fused amorphous silica; corundum, wollastonite, aramide fibers, fiberglass, $Ba_2Ti_9O_{20}$, glass spheres, quartz, boron nitride, aluminum nitride, silicon carbide, beryllia, alumina, magnesia, mica, talcs, nanoclays, aluminosilicates, magnesium hydroxide, or a combination comprising at least one of the foregoing fillers.

20. The organosilicon composite of claim 1, wherein the hydrophobic treatment comprises a silane treatment or a hydride-substituted diorganosiloxane treatment.

21. A circuit subassembly comprising:
a layer of the organosilicon composite of claim 1, the layer having a first side and a second side; and
a conductive layer disposed on the first side of the organosilicon composite layer.

22. The circuit subassembly of claim 21, further comprising an adhesive layer disposed between the conductive layer and the organosilicon composite layer, wherein the adhesive layer comprises a poly(arylene ether).

23. A composition for the formation of the organosilicon composite of claim 1, comprising:
30 to 90 vol. % of an organosilicon copolymer having silicon-containing repeating units comprising a silicon hydride and silicon-containing repeating units comprising a $C_{1-10}$ ethylenically unsaturated group; and
10 to 70 vol. % of a dielectric filler having a hydrophobically-treated surface.

24. A method for making an organosilicon composite, comprising curing a composition comprising
30 to 90 vol. % of an organosilicon copolymer having silicon-containing repeating units comprising a silicon hydride and silicon-containing repeating units comprising a $C_{1-10}$ ethylenically unsaturated group; and
10 to 70 vol. % of a dielectric filler having a hydrophobically-treated surface; wherein the treated filler has a hydrophobicity such that a time to sink of the composite in water is greater than 10 minutes at 23° C. and/or the composite has a water absorption of less than 0.2% over 24 hours at 23° C.

* * * * *